United States Patent

[11] 3,582,811

[72] Inventor Floyd E. Kingston
Palo Alto
[21] Appl. No. 838,765
[22] Filed July 3, 1969
[45] Patented June 1, 1971
[73] Assignee Varian Associates
Palo Alto, Calif.

[54] CLOSED LOOP TRACKING OSCILLATOR
2 Claims, 3 Drawing Figs.

[52] U.S. Cl. .......... 331/10, 331/178
[51] Int. Cl. .......... H03b 23/00
[50] Field of Search .......... 331/177, 177 V, 178, 180, 181, 4, 10—13

[56] References Cited
UNITED STATES PATENTS

| | | | |
|---|---|---|---|
| 3,218,571 | 11/1965 | Shannon et al. | 331/4 |
| 3,221,266 | 11/1965 | Vitkovits, Jr. | 331/4X |
| 3,493,883 | 2/1970 | Mead et al. | 331/4 |
| 3,514,712 | 5/1970 | Sinclair et al. | 331/178X |

*Primary Examiner*—Roy Lake
*Assistant Examiner*—Siegfried H. Grimm
*Attorneys*—Stanley Z. Cole and Leon F. Herbert

ABSTRACT: A closed loop tracking oscillator is disclosed. A voltage tunable oscillator causes its output frequency to track an input signal by converting a sampled portion of its output frequency to a voltage which varies in accordance with the output frequency. This voltage is compared with the input signal to be tracked to derive an error signal which is amplified and fed to the voltage tunable oscillator to be superimposed upon the input signal to reduce the tracking error toward zero.

INVENTOR.
FLOYD E. KINGSTON
BY Stanley Z. Cole
ATTORNEY

CLOSED LOOP TRACKING OSCILLATOR

DESCRIPTION OF THE PRIOR ART

Heretofore, open loop tracking oscillators have been employed to obtain linear sweeps of frequency. Such oscillators have used varactor diodes to provide a voltage variable capacitive element in an L–C tuned circuit. The varactors were specially selected to match their voltage-capacitance curves to the capacity-frequency curves of the tuned circuit. Such oscillators have provided tuning linearity of ±2 percent over their entire tuning range at radio frequencies and ±0.2 percent at audiofrequencies.

SUMMARY OF THE PRESENT INVENTION

The principal object of the present invention is the provision of an improved tracking oscillator.

One feature of the present invention is the provision of a frequency-to-voltage converter for converting a sample of the output frequency of a voltage tunable oscillator into a voltage proportional to the output frequency and comparing the derived voltage with a voltage to be tracked, in frequency, to derive an error voltage which is amplified and fed to the voltage tunable oscillator as a corrective component superimposed upon the tuning voltage to be tracked, thereby minimizing the tracking error.

Another feature of the present invention is the same as the preceding feature wherein the voltage tunable oscillator is a radiofrequency oscillator and a mixer is employed for mixing a stable radiofrequency reference signal with the output frequency to derive an audio beat frequency which is proportional to the radiofrequency output frequency and which beat frequency is converted into the voltage compared with the voltage to be tracked to derive the error voltage.

Other features and advantages of the present invention will become apparent upon a perusal of the following specification taken in connection with the accompanying drawings wherein:

DESCRIPTION OF THE PREFERRED EMBODIMENTS

Figure 1:
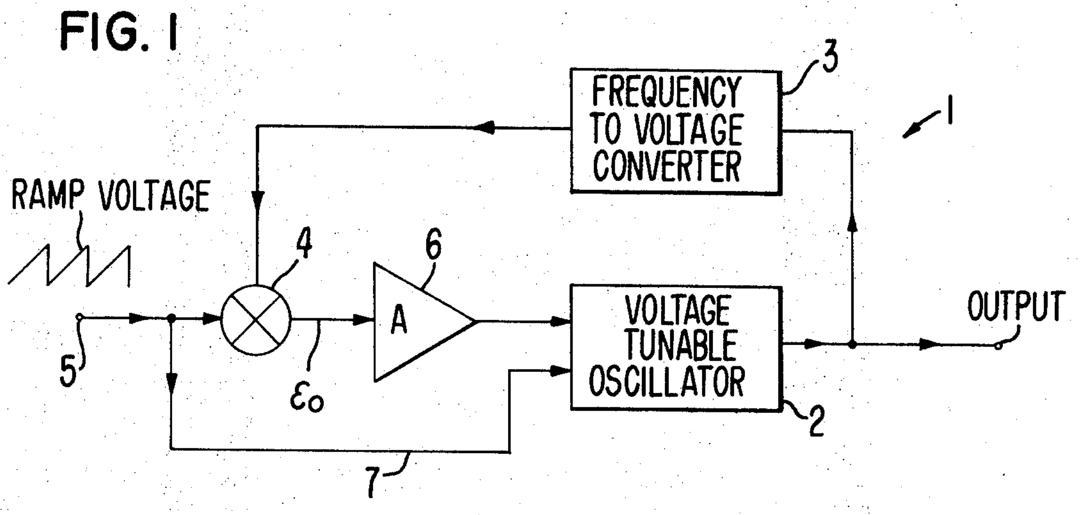
FIG. 1 is a schematic block diagram of a closed loop tracking oscillator of the present invention.

Referring now to FIG. 1, there is shown a closed loop tracking oscillator 1 incorporating features of the present invention. The oscillator 1 includes a voltage tunable audio oscillator 2 having a tracking error, i.e., departure from linearity of, for example, ±2 percent and which it is desired to reduce by a factor of 10. A sample of the output frequency of the oscillator 2 is fed to a frequency-to-voltage converter 3 to produce an output voltage proportional to the output frequency of oscillator 2. A typical frequency-to-voltage converter 3 includes a differentiator followed by a Schmitt trigger for generating a train of square pulses of uniform height and width with a frequency proportional to the sampled output frequency. The train of square pulses are then integrated by an integrator to produce the output voltage of an amplitude proportional to the sampled output frequency.

The output voltage of the frequency-to-voltage converter 3 is fed to one input of an error detector 4 for comparison with an input voltage to be tracked as applied to input terminal 5. In a typical example, the input voltage comprises a ramp having a precise and constant slope.

Figure 3:
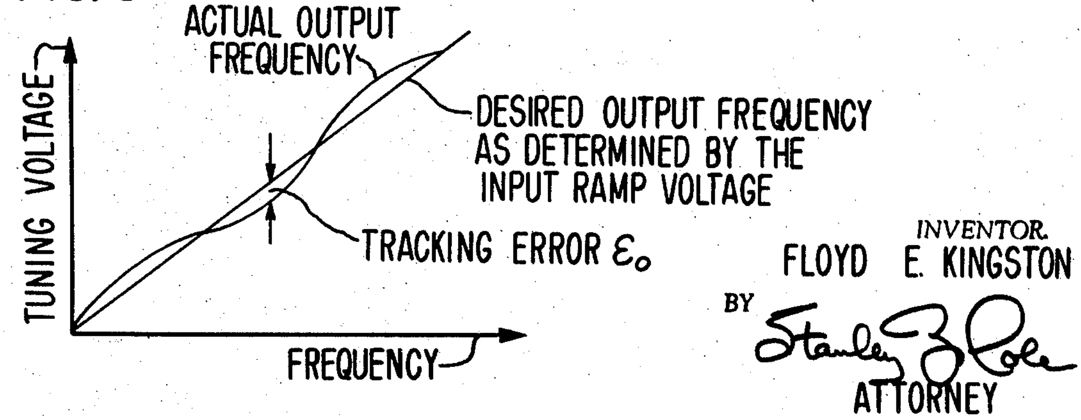
FIG. 3 is a plot of voltage versus frequency depicting tracking error for oscillators of FIGS. 1 and 2.

The error detector 4 subtracts the two input voltages to derive a DC error output voltage $E_o$ representative of the sense and amplitude of the departure of the output frequency from a desired output frequency as determined by the input ramp voltage to be tracked. The error voltage $E_o$ is fed to an amplifier 6 wherein it is amplified and thence fed to the voltage tuned input terminal of the voltage tuned oscillator 2 where it is superimposed as a corrective component upon the input ramp voltage applied directly to the voltage tuned input terminal of the voltage tuned oscillator 2 via lead 7. The inherent tracking error (see FIG. 3) of the voltage tuned oscillator 2, without feedback correction, is decreased by the factor of the feedback loop gain when feedback is employed. Thus, if the feedback loop gain is 10 the inherent tracking error is reduced by a factor of 10. Feedback loop gains of 10 to 100 are readily achievable to reduce the tracking error to ±0.2 percent to ±0.02 percent when the oscillator 2 has an inherent tracking error of ±2 percent.

Figure 2:
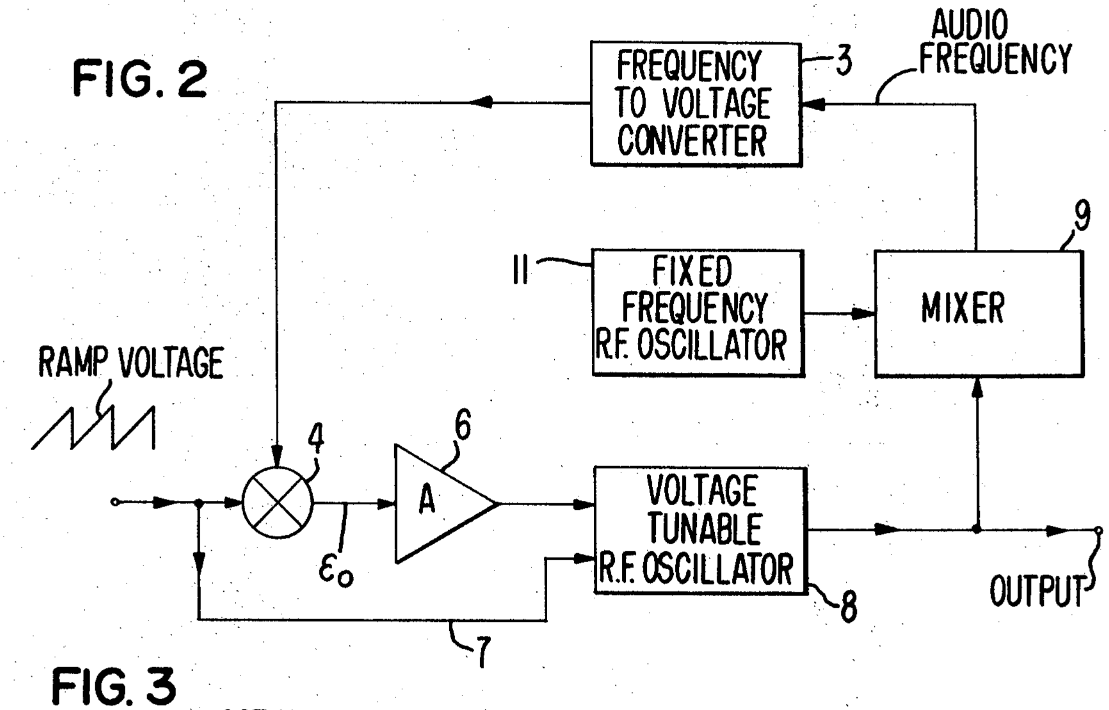
FIG. 2 is a schematic diagram of an alternative embodiment of the circuit of FIG. 1.

Referring now to FIG. 2, there is shown an alternative embodiment of the circuit of FIG. 1. More specifically, the circuit is essentially identical to that of FIG. 1 except that the voltage tunable oscillator is a radiofrequency voltage tuned oscillator 8, such as a voltage tuned crystal oscillator operable in the tens to hundreds of MHz. The radiofrequency output is sampled and fed to a radiofrequency mixer 9 wherein it is heterodyned with a stable fixed radiofrequency derived from a fixed frequency radiofrequency oscillator 11 to obtain a conveniently low audiofrequency output. This audiofrequency differs from the output radiofrequency by a fixed number of Hz. so that, for example, if the radiofrequency increases by 100 Hz., the audiofrequency also increases by 100 Hz. The audiofrequency output of mixer 9 is then fed to the frequency-to-voltage converter 3, as in the circuit of FIG. 1. The remainder of the circuit functions in the same manner as the corresponding portions of the circuit of FIG. 1 to produce a substantial improvement in the linearity of the output frequency versus tuning voltage characteristic.

The advantage of the feedback frequency correction of FIGS. 1 and 2 is that it permits relatively inexpensive and inherently nonlinear voltage controlled oscillators to be employed to provide highly linear tuning voltage versus output frequency characteristic over relatively wide tuning ranges, as of 10 kHz.

Since many changes could be made in the above construction and many apparently widely different embodiments of this invention could be made without departing from the scope thereof, it is intended that all matter contained in the above description or shown in the accompanying drawings shall be interpreted as illustrative and not in a limiting sense.

What we claim is:

1. In a closed loop oscillator circuit, means forming an electrically voltage tunable oscillator having an output frequency variable in accordance with the intensity of a first electrical input voltage to said oscillator, means for sampling a frequency determinative of the output frequency of said oscillator and for converting the sampled frequency to a second electrical voltage having an amplitude which varies in accordance with the sampled output frequency of said oscillator, means forming an error detector, feedback means for feeding said second electrical voltage to said error detector for comparison therein with a third input electrical voltage to be tracked to produce an error voltage representative of the frequency deviation of the output frequency from a certain desired output frequency as determined by the intensity of said third electrical voltage, means for amplifying the error voltage and feeding same to said oscillator as a corrective component, and means for feeding said first electrical input voltage as an additional input to said oscillator and said error detector is a comparator circuit for subtracting said second voltage from said third voltage to derive said error voltage.

2. The apparatus of claim 1 wherein said oscillator is a radiofrequency oscillator, means for heterodyning a sample of the radiofrequency output signal from said radiofrequency oscillator with a fixed reference radiofrequency to derive a difference audiofrequency which is proportional to the output radiofrequency of said oscillator, said frequency sampling means being operative upon the audiofrequency to derive said second electrical voltage.